(12) United States Patent
Zheng

(10) Patent No.: US 11,130,154 B2
(45) Date of Patent: Sep. 28, 2021

(54) ULTRASONIC SENSOR, ELECTRONIC DEVICE USING SAME, AND METHOD FOR MAKING SAME

(71) Applicant: RECO TECHNOLOGY (CHENGDU) CO., LTD., Chengdu (CN)

(72) Inventor: Xiao-Bing Zheng, Shenzhen (CN)

(73) Assignee: Reco Technology (Chengdu) Co., Ltd., Chengdu (CN)

( * ) Notice: Subject to any disclaimer, the term of this patent is extended or adjusted under 35 U.S.C. 154(b) by 786 days.

(21) Appl. No.: 15/940,917

(22) Filed: Mar. 29, 2018

(65) Prior Publication Data
US 2019/0009302 A1 Jan. 10, 2019

(30) Foreign Application Priority Data
Jul. 6, 2017 (CN) .......................... 201710548230.5

(51) Int. Cl.
| | |
|---|---|
| B06B 1/06 | (2006.01) |
| H01L 41/113 | (2006.01) |
| H01L 41/09 | (2006.01) |
| H01L 41/338 | (2013.01) |
| H01L 41/18 | (2006.01) |
| H01L 41/04 | (2006.01) |
| H01L 41/311 | (2013.01) |
| H01L 41/187 | (2006.01) |
| H01L 41/047 | (2006.01) |

(52) U.S. Cl.
CPC .......... *B06B 1/0644* (2013.01); *H01L 41/042* (2013.01); *H01L 41/0478* (2013.01); *H01L 41/09* (2013.01); *H01L 41/1132* (2013.01); *H01L 41/183* (2013.01); *H01L 41/187* (2013.01); *H01L 41/311* (2013.01); *H01L 41/338* (2013.01)

(58) Field of Classification Search
CPC ... B06B 1/0644; H01L 41/1132; H01L 41/09; H01L 41/338
See application file for complete search history.

(56) References Cited

U.S. PATENT DOCUMENTS

| | | | |
|---|---|---|---|
| 2014/0191221 A1* | 7/2014 | Benwadih | G01L 9/08 257/40 |
| 2015/0016223 A1* | 1/2015 | Dickinson | G06F 3/0436 367/87 |
| 2015/0255699 A1* | 9/2015 | Elmegreen | H01L 49/00 310/366 |
| 2016/0149116 A1* | 5/2016 | Wang | G06K 9/0002 310/316.01 |
| 2016/0315246 A1* | 10/2016 | Wang | G06K 9/0002 |
| 2017/0219444 A1* | 8/2017 | Kim | G01L 1/22 |

* cited by examiner

*Primary Examiner* — Bryan P Gordon
(74) *Attorney, Agent, or Firm* — ScienBiziP, P.C.

(57) ABSTRACT

A thin-profile ultrasonic sensor includes a piezoelectric material layer having a first surface and a second surface, a plurality of thin film transistors (TFTs) on the first surface, and an electrode layer on the second surface. The first surface and the second surface are on opposite sides facing away from each other. The piezoelectric material layer is configured as a substrate to support the plurality of TFTs, no other substrate being required. The piezoelectric material layer is configured to transmit and receive ultrasonic signals.

17 Claims, 6 Drawing Sheets

ULTRASONIC SENSOR, ELECTRONIC DEVICE USING SAME, AND METHOD FOR MAKING SAME

FIELD

The subject matter herein generally relates to an ultrasonic sensor, a method for making the ultrasonic sensor, and an electronic device using the ultrasonic sensor.

BACKGROUND

Generally, two types of sensors (for example, optical sensors and ultrasonic sensor) are used in electronic device. The ultrasonic sensor generally includes a substrate, an ultrasonic transmitter, and an ultrasonic receiver on the substrate. The ultrasonic transmitter is configured to transmit ultrasonic signals, and the ultrasonic receiver is configured to receive ultrasonic signals reflected back by an object. It is desirable to decrease thickness of the ultrasonic sensor. Therefore, there is room for improvement in the art.

BRIEF DESCRIPTION OF THE DRAWINGS

Implementations of the present technology will now be described, by way of example only, with reference to the attached figures.

DETAILED DESCRIPTION

Figure 1:
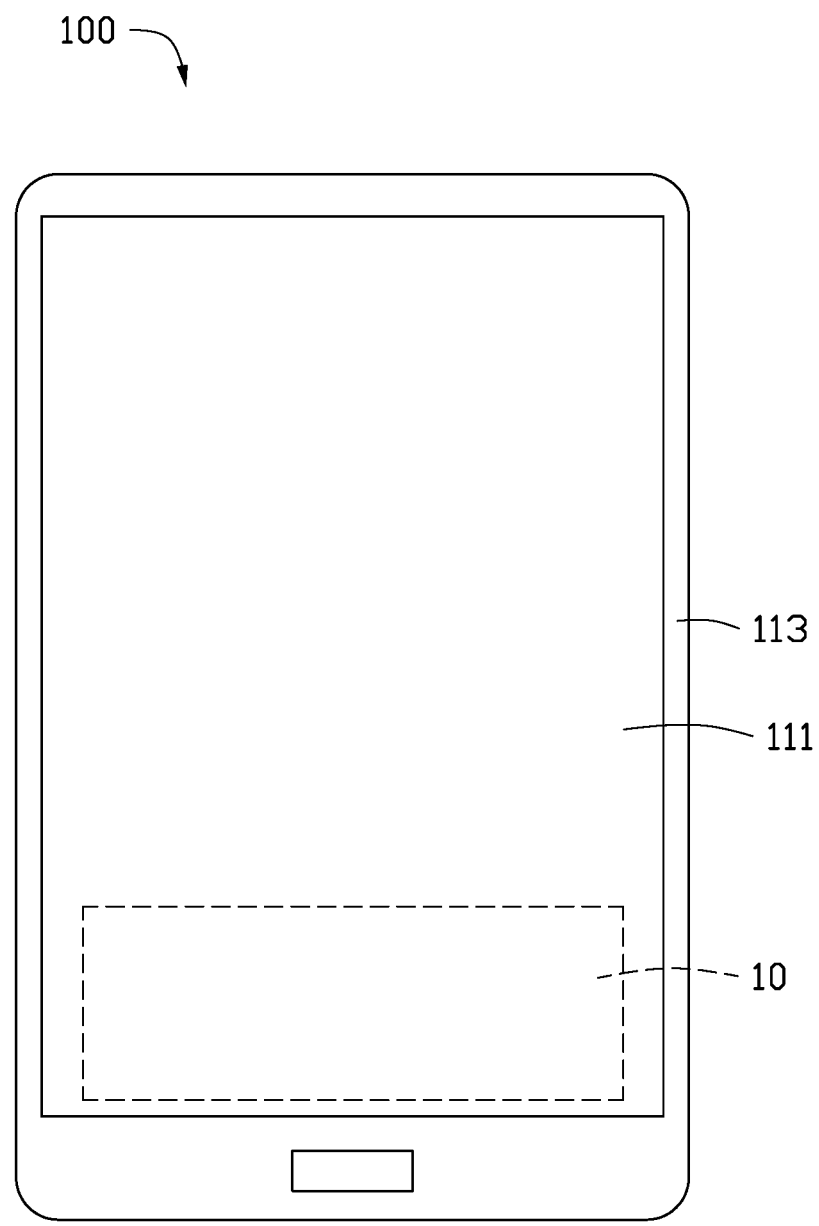
FIG. 1 is an isometric view of a first embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

FIG. 1 illustrates an electronic device 100 according to an embodiment. The electronic device 100 can be a display device, such as a mobile phone, a tablet computer, or the like. In this embodiment, the electronic device 100 is a mobile phone. The electronic device 100 defines a display area 111 and a non-display area 113 surrounding the display area 111. The electronic device 100 includes an ultrasonic sensor 10 located in the display area 111. The ultrasonic sensor 10 is configured to identify fingerprint when a finger touches the electronic device 100. The ultrasonic sensor 10 is not limited to being in the display area 111, but can be positioned in any area of the electronic device, such as the non-display area 113.

Figure 2:
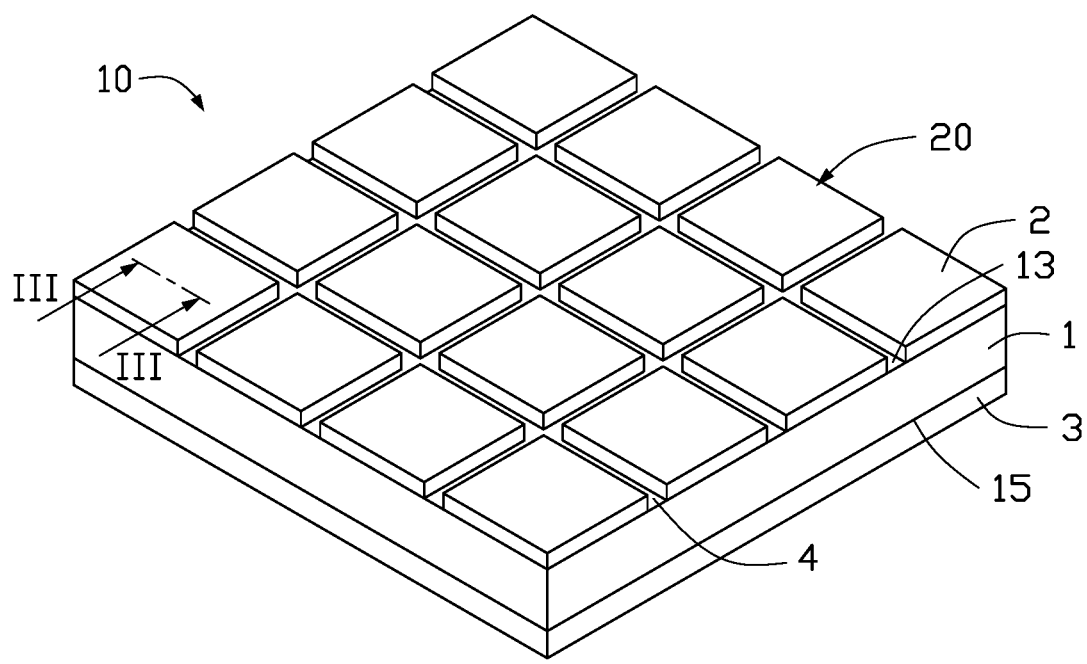
FIG. 2 is an isometric view of an embodiment of an ultrasonic sensor in the electronic device of FIG. 1.

FIG. 2 illustrates the ultrasonic sensor 10 according to an embodiment. The ultrasonic sensor 10 includes a piezoelectric material layer 1, a plurality of thin film transistors (TFTs) 2 formed on a first surface 13 of the piezoelectric material layer 1, and an electrode layer 3 formed on a second surface 15 of the piezoelectric material layer 1. The first surface 13 and the second surface 15 are on opposite sides of the piezoelectric material layer 1 facing away from each other. The plurality of TFTs 2 is spaced apart from each other. In this embodiment, the plurality of TFTs 2 is arranged in a matrix to form a TFT array 20. The piezoelectric material layer 1 is configured as a substrate to support the TFT array 20, thus no additional substrate (e. g. glass substrate) is needed to support the TFT array 20. Thus, the ultrasonic sensor 10 may be integrated with a TFT array substrate of a display device.

Figure 3:
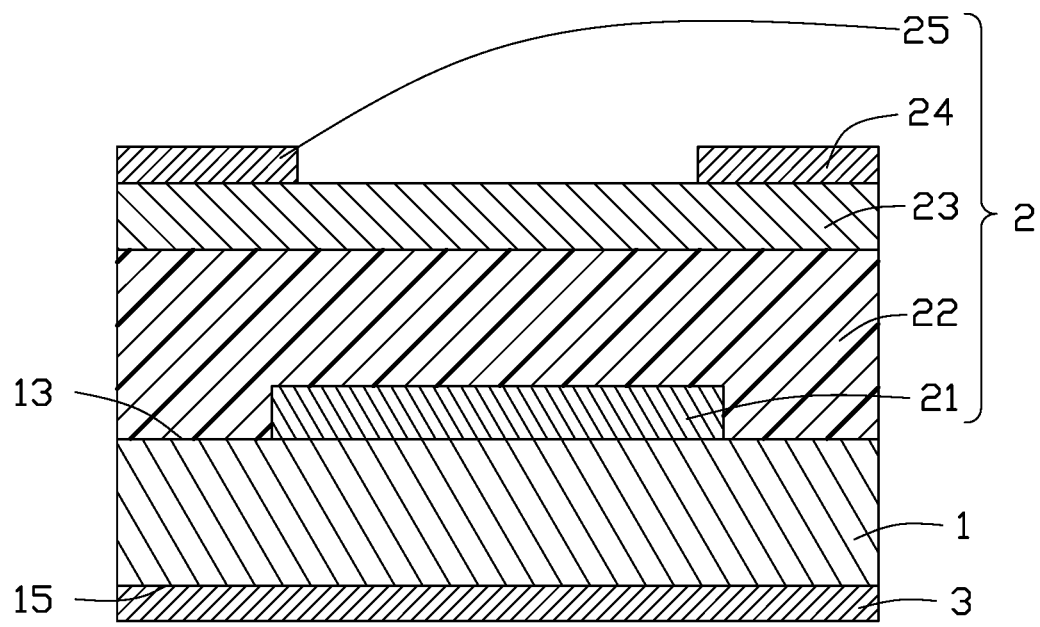
FIG. 3 is a cross-sectional view of a first embodiment of the ultrasonic sensor of FIG. 2 along line III-III.

As shown in FIG. 2, the piezoelectric material layer 1 is formed between the TFT array 20 and the electrode layer 3. FIG. 3 is a cross-sectional view of the ultrasonic sensor 10 according to a first embodiment. As shown in FIG. 3, each TFT 2 includes a gate electrode 21 formed on the first surface 13 of the piezoelectric material layer 1, an insulating layer 22 formed on the first surface 13 of the piezoelectric material layer 1 and covering the gate electrode 21, a semiconductor layer 23 formed on the insulating layer 22, and a source electrode 24 and a drain electrode 25 formed on and coupled to the semiconductor layer 23. In this embodiment, each TFT 2 may be an organic TFT having a semiconductor layer 23 made of organic material. The TFTs 2 can be made at a lower temperature, thus the ultrasonic sensor 10 can be made at a lower temperature. In this embodiment, the semiconductor layer 23 is made of pentacene, but not limited to being pentacene.

The piezoelectric material layer 1 may be made of polyvinylidene fluoride (PVDF) or piezoelectric ceramic transducer (PZT). In this embodiment, the piezoelectric material layer 1 is made of PVDF.

In this embodiment, the piezoelectric material layer 1 of PVDF is flexible thus the ultrasonic sensor 10 can also be flexible, so that the ultrasonic sensor 10 can be applied in a flexible electronic device. The piezoelectric material layer 1, the TFT array 20, and the electrode layer 3 are all light-transmissive, and light-transmittances of the piezoelectric material layer 1, the TFT array 20, and the electrode layer 3 are all greater than 95%. Thus, the ultrasonic sensor 10 is light-transmissive, and the transmittance of the ultrasonic sensor 10 is greater than 95%.

The electrode layer 3 may be made of a light-transmissive and electrically conductive material, such as indium tin oxide (ITO), poly (3, 4-ethylene two oxygen thiophene)-polystyrene sulfonic acid, carbon nano tube, silver nano wire, and grapheme.

The piezoelectric material layer 1 not only serves as a substrate to carry the TFTs 2, but also configured to transmit ultrasonic signals and receive ultrasonic signals. Specifically, the piezoelectric material layer 1 may be controlled by a driving IC (not shown) to transmit ultrasonic signals and receive ultrasonic signals in different periods.

When the ultrasonic sensor 10 is working, a voltage difference is formed between the electrode layer 3 and a conductive element of the TFT 2, and the piezoelectric material layer 1 vibrates and emits ultrasonic waves under the voltage difference. For example, a voltage difference is formed between the electrode layer 3 and the gate electrode 21 of the TFT 2. That is, the gate electrode 21 of the TFT 2 is also configured as an electrode of the piezoelectric material layer 1 and cooperates with the electrode layer 3 to drive the piezoelectric material layer 1. When a finger touches the electronic device 100, the ultrasonic wave emitted by the piezoelectric material layer 1 reaches the finger and is reflected by the finger back into the piezoelectric material layer 1. Due to the tiny ravines on the skin surface of the finger, the reflected ultrasonic wave changes, and the piezoelectric material layer 1 receives the reflected ultrasonic wave and generates a charge accumulation inside. The accumulated charges form electrical signals and the electrical signals are transmitted by the electrode layer 3 to a processer (not shown). The processor receives the electrical signals and converts the electrical signals into a grayscale image of a fingerprint.

Figure 4:
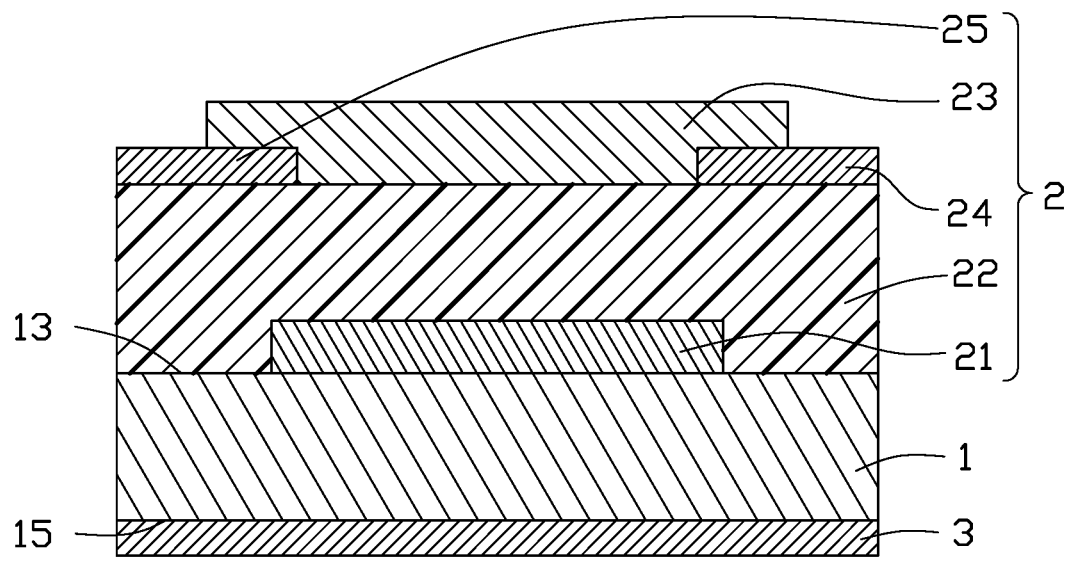
FIG. 4 is a cross-sectional view of a second embodiment of the ultrasonic sensor of FIG. 2 along line III-III.

FIG. 4 is a cross-sectional view of the ultrasonic sensor 10 according to a second embodiment. As shown in FIG. 4, each TFT 2 includes a gate electrode 21 formed on the first surface 13 of the piezoelectric material layer 1, an insulating layer 22 formed on the first surface 13 of the piezoelectric material layer 1 and covering the gate electrode 21, and a source electrode 24 and a drain electrode 25 formed on the insulating layer 23. A semiconductor layer 23 is formed on the insulating layer 22 and covers the source electrode 24 and the drain electrode 25 to electrically couple to the source electrode 24 and the drain electrode 25. As FIG. 3 shows, the semiconductor layer 23 covers a surface of the source electrode 24 adjacent to the insulating layer 22 and a surface of the drain electrode 25 adjacent to the insulating layer 22. In this embodiment, as shown in FIG. 4, the semiconductor layer 23 covers a surface of the source electrode 24 away from the insulating layer 22 and a surface of the drain electrode 25 away from the insulating layer 22.

In this embodiment, each TFT 2 may be an organic TFT having a semiconductor layer 23 made of organic material, thus the ultrasonic sensor 10 can be made at a lower temperature. In this embodiment, the semiconductor layer 23 is made of pentacene, but not limited to being pentacene.

Figure 5:
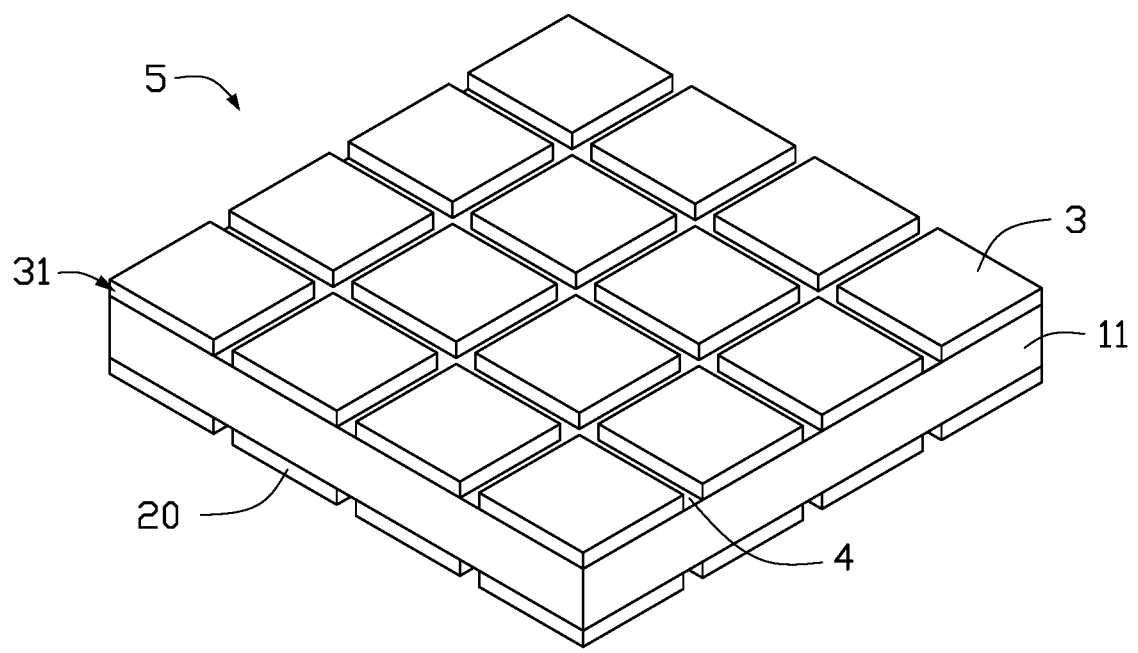
FIG. 5 and FIG. 6 show a method for making the ultrasonic sensor.
Figure 6:
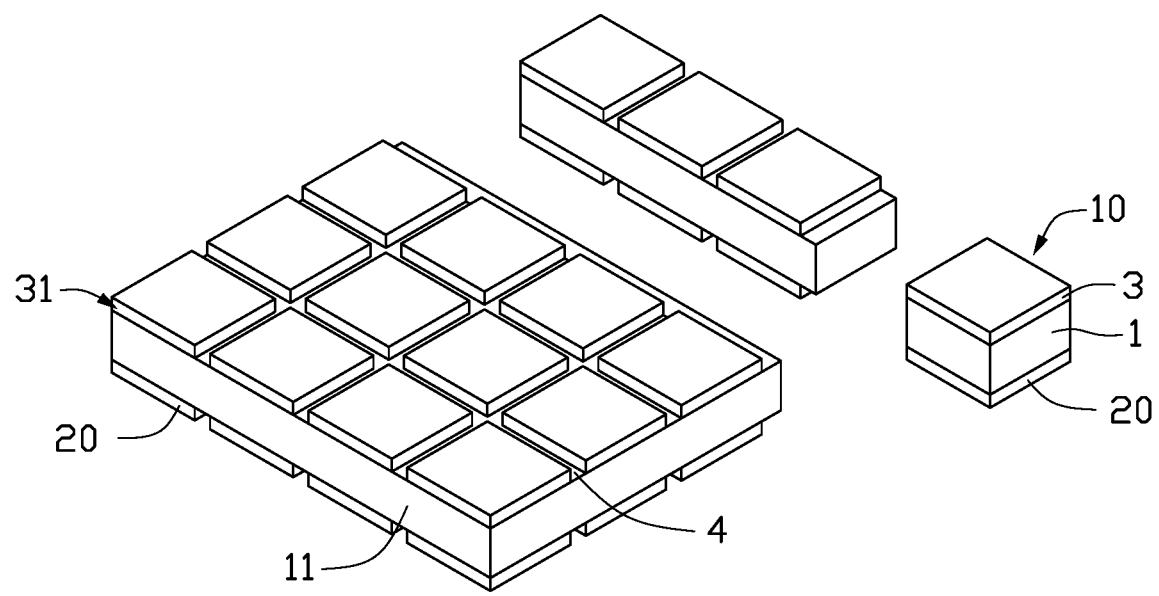

FIG. 5 and FIG. 6 illustrate a method for making the ultrasonic sensor 10. The method according to a first embodiment of the present disclosure includes the following steps.

Step S1: as shown in FIG. 5, a mother piezoelectric material layer 11 is provided, and a plurality of TFT arrays 20 is formed on a first surface of the mother piezoelectric material layer 11. A patterned conductive layer 31 is formed on a second surface of the mother piezoelectric material layer 11. The first surface and the second surface are on opposite sides of the mother piezoelectric material layer 11 facing away from each other. In this embodiment, the TFT arrays 30 are spaced apart from each other. Each TFT array 20 includes a plurality of TFTs arranged in an array, and the patterned conductive layer 31 includes a plurality of electrode layers 3 spaced apart from each other and arranged in an array. Each TFT array 20 corresponds to one electrode layer 3 and overlaps with one electrode layer 3. The mother piezoelectric material layer 11 defines a plurality of cutting lines 4; each cutting line 4 is located between every two adjacent TFT arrays 20. A cutting line 4 is also located between every two adjacent electrode layers 3. The mother piezoelectric material layer 11 can be cut into a plurality of piezoelectric material layers 1 along the cutting lines 4. The mother piezoelectric material layer 11, the patterned conductive layer 31, and the TFT arrays 20 cooperatively form a stack 5.

The patterned conductive layer 31 can be formed on the mother piezoelectric material layer 11 by a screen printing method, but is not limited to the screen printing method. The mother piezoelectric material layer 11 is configured as a substrate to carry/support the plurality of TFT arrays, thus no additional substrate (e.g. glass substrate) is needed.

Step S2: as shown in FIG. 6, the stack 5 is cut along the cutting lines 4 to form a plurality of independent ultrasonic sensors 10. In this embodiment, only the mother piezoelectric material layer 11 is cut, the patterned conductive layer 31 and the TFT arrays 20 are not cut.

The above described method only requires one cutting process, the mother piezoelectric material layer 11 being cut to form a plurality of independent ultrasonic sensors 10. Thus, the manufacturing process can be simplified, the manufacturing cost can be reduced, and thickness of the ultrasonic sensor 10 can be reduced.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:
1. An ultrasonic sensor, comprising:
a piezoelectric material layer having a first surface and a second surface, the first surface and the second surface being on two opposite sides facing away from each other;
a plurality of thin film transistors (TFTs) on the first surface of the piezoelectric material layer; and
an electrode layer on the second surface of the piezoelectric material layer;
wherein the piezoelectric material layer is configured as a substrate to support the plurality of TFTs, and the piezoelectric material layer is configured to transmit ultrasonic signals and receive ultrasonic signals;
wherein the piezoelectric material layer is configured to emit ultrasonic waves under a voltage difference formed between the electrode layer and a conductive element of the TFT.

2. The ultrasonic sensor of claim 1, wherein the plurality of TFTs is arranged in an array.

3. The ultrasonic sensor of claim 1, wherein the piezoelectric material layer is made of polyvinylidene fluoride or piezoelectric ceramic transducer.

4. The ultrasonic sensor of claim 1, wherein each of the plurality of TFTs comprises a gate electrode formed on the piezoelectric material layer, an insulating layer formed on the piezoelectric material layer and covering the gate electrode, a semiconductor layer formed on the insulating layer, and a source electrode and a drain electrode coupled to the semiconductor layer; the voltage difference is formed between the electrode layer and the gate electrode.

5. The ultrasonic sensor of claim 4, wherein the semiconductor layer covers a surface of the source electrode adjacent to the insulating layer and a surface of the drain electrode adjacent to the insulating layer.

6. The ultrasonic sensor of claim 4, wherein the semiconductor layer covers a surface of the source electrode away from the insulating layer and a surface of the drain electrode away from the insulating layer.

7. The ultrasonic sensor of claim 4, wherein the semiconductor layer is made of pentacene.

8. The ultrasonic sensor of claim 1, wherein the ultrasonic sensor is flexible.

9. An electronic device, comprising:
an ultrasonic sensor, the ultrasonic sensor comprising:
a piezoelectric material layer having a first surface and a second surface, the first surface and the second surface being on two opposite sides facing away from each other;
a plurality of thin film transistors (TFTs) on the first surface of the piezoelectric material layer; and
an electrode layer on the second surface of the piezoelectric material layer;
wherein the piezoelectric material layer is configured as a substrate to support the plurality of TFTs, and the piezoelectric material layer is configured to transmit ultrasonic signals and receive ultrasonic signals;
wherein the piezoelectric material layer is configured to emit ultrasonic waves under a voltage difference formed between the electrode layer and a conductive element of the TFT.

10. The electronic device of claim 9, wherein the plurality of TFTs is arranged in an array; the piezoelectric material layer is made of polyvinylidene fluoride or piezoelectric ceramic transducer.

11. The electronic device of claim 9, wherein each of the plurality of TFTs comprises a gate electrode formed on the piezoelectric material layer, an insulating layer formed on the piezoelectric material layer and covering the gate electrode, a semiconductor layer formed on the insulating layer, and a source electrode and a drain electrode coupled to the semiconductor layer; the voltage difference is formed between the electrode layer and the gate electrode.

12. The electronic device of claim 11, wherein the semiconductor layer covers a surface of the source electrode adjacent to the insulating layer and a surface of the drain electrode adjacent to the insulating layer.

13. The electronic device of claim 11, wherein the semiconductor layer covers a surface of the source electrode away from the insulating layer and a surface of the drain electrode away from the insulating layer.

14. The electronic device of claim 11, wherein the semiconductor layer is made of pentacene.

15. The electronic device of claim 11, wherein the ultrasonic sensor is flexible; and the electronic device is flexible.

16. A method for making an ultrasonic sensor, comprising:
providing a mother piezoelectric material layer having a first surface and a second surface, the first surface and the second surface being on two opposite sides facing away from each other;
forming a plurality of TFT arrays on the first surface of the mother piezoelectric material layer;
forming a patterned conductive layer on the second surface of the mother piezoelectric material layer, the patterned conductive layer comprising a plurality of electrode layers, each of the plurality of electrode layers corresponding to one of the plurality of TFT arrays, the mother piezoelectric material layer, the patterned conductive layer, and the plurality of TFT arrays cooperatively forming a stack;
cutting the stack to form a plurality of ultrasonic sensors independent from each other, each of the plurality of ultrasonic sensors comprising a piezoelectric material layer, one of the plurality of TFT arrays, and one of electrode layers;
wherein the piezoelectric material layer is configured to emit ultrasonic waves under a voltage difference formed between the one of electrode layers and a conductive element of the one of the plurality of TFT arrays.

17. The method of claim 16, wherein the mother piezoelectric material layer defines a plurality of cutting lines; each cutting line is located between every two adjacent TFT arrays and is also located between every two adjacent electrode layers, the stack is cut along the plurality of cutting lines.

* * * * *